United States Patent
Kodera et al.

(10) Patent No.: US 10,586,694 B2
(45) Date of Patent: Mar. 10, 2020

(54) METHOD FOR FABRICATING SEMICONDUCTOR DEVICE

(71) Applicant: Toshiba Memory Corporation, Tokyo (JP)

(72) Inventors: Masako Kodera, Kanagawa-ken (JP); Hiroshi Tomita, Kanagawa-ken (JP); Takeshi Nishioka, Kanagawa-ken (JP)

(73) Assignee: Toshiba Memory Corporation, Tokyo (JP)

( * ) Notice: Subject to any disclaimer, the term of this patent is extended or adjusted under 35 U.S.C. 154(b) by 35 days.

(21) Appl. No.: 15/241,256

(22) Filed: Aug. 19, 2016

(65) Prior Publication Data
US 2016/0358768 A1 Dec. 8, 2016

Related U.S. Application Data

(63) Continuation of application No. 13/599,493, filed on Aug. 30, 2012, now abandoned.

(30) Foreign Application Priority Data

Feb. 21, 2012 (JP) .................. 2012-035018

(51) Int. Cl.
*H01L 21/02* (2006.01)
*H01L 21/027* (2006.01)
(Continued)

(52) U.S. Cl.
CPC ...... *H01L 21/02057* (2013.01); *B24B 37/042* (2013.01); *B82Y 10/00* (2013.01);
(Continued)

(58) Field of Classification Search
None
See application file for complete search history.

(56) References Cited

U.S. PATENT DOCUMENTS 5,558,568 A 9/1996 Talieh et al.
5,593,344 A 1/1997 Weldon et al.
(Continued)

FOREIGN PATENT DOCUMENTS

JP 8-55826 2/1996
JP H 8-195365 7/1996
(Continued)

OTHER PUBLICATIONS

Definiton of "Corresponding". From Dictionary.com. Accessed on Jul. 24, 2019. (Year: 2019).*
(Continued)

*Primary Examiner* — Allan W. Olsen
*Assistant Examiner* — Margaret D Klunk
(74) *Attorney, Agent, or Firm* — Finnegan, Henderson, Farabow, Garrett & Dunner, L.L.P.

(57) ABSTRACT

According to one embodiment, a method for fabricating a semiconductor device includes performing a back surface processing to remove at least one of a scratch and a foreign material formed on a back surface of a substrate to be processed, a front surface of the substrate being retained in a non-contact state, contacting the back surface of the substrate to a stage to be retained, and providing a pattern on the front surface of the substrate by using lithography.

11 Claims, 5 Drawing Sheets

(51) Int. Cl.
*B24B 37/04* (2012.01)
*H01L 21/67* (2006.01)
*B82Y 40/00* (2011.01)
*G03F 7/09* (2006.01)
*B82Y 10/00* (2011.01)
*G03F 7/00* (2006.01)

(52) U.S. Cl.
CPC .............. *B82Y 40/00* (2013.01); *G03F 7/092* (2013.01); *H01L 21/0209* (2013.01); *H01L 21/0274* (2013.01); *H01L 21/67051* (2013.01); *G03F 7/0002* (2013.01)

(56) References Cited

U.S. PATENT DOCUMENTS

| | | | |
|---|---|---|---|
| 5,747,385 | A | 5/1998 | Torii |
| 5,780,204 | A | 7/1998 | La et al. |
| 5,846,335 | A | 12/1998 | Maekawa et al. |
| 5,906,532 | A | 5/1999 | Nakajima et al. |
| 5,980,368 | A | 11/1999 | Chang et al. |
| 8,197,300 | B2 | 6/2012 | Junge et al. |
| 2001/0041446 | A1* | 11/2001 | Takahashi ........... H01L 21/3212 438/692 |
| 2002/0173252 | A1 | 11/2002 | Li |
| 2003/0191551 | A1 | 10/2003 | Gotoh et al. |
| 2003/0203649 | A1 | 10/2003 | Carter |
| 2004/0147204 | A1 | 7/2004 | Sakai |
| 2007/0270080 | A1* | 11/2007 | Barada .................... B24B 37/30 451/5 |
| 2008/0268753 | A1 | 10/2008 | Ishikawa et al. |
| 2009/0298388 | A1* | 12/2009 | Li ........................... B24B 21/04 451/6 |
| 2013/0213437 | A1 | 8/2013 | Ishii et al. |

FOREIGN PATENT DOCUMENTS

| | | |
|---|---|---|
| JP | 08339979 A * | 12/1996 |
| JP | 9-45684 | 2/1997 |
| JP | 11-000854 | 1/1999 |
| JP | 11-077495 | 3/1999 |
| JP | 2000-254861 | 9/2000 |
| JP | 2003-220549 | 8/2003 |
| JP | 2003-297901 | 10/2003 |
| JP | 2003-297901 A | 10/2003 |
| JP | 2004-223639 | 8/2004 |
| JP | 2006-319249 | 11/2006 |
| JP | 2006-319249 A | 11/2006 |
| JP | 2007-299994 | 11/2007 |
| JP | 2007-299994 A | 11/2007 |
| JP | 2008-270818 A | 11/2008 |
| JP | 2009-095976 | 5/2009 |
| JP | 2010-62403 | 3/2010 |
| JP | 2010-62403 A | 3/2010 |

OTHER PUBLICATIONS

Notice of Reasons for Refusal issued by the Japanese Patent Office dated Mar. 15, 2016, in counterpart Japanese Application No. 2013-022391.

Notice of Reasons for Rejection issued by the Japanese Patent Office dated Oct. 11, 2016, in counterpart Japanese Application No. 2013-022391.

* cited by examiner

METHOD FOR FABRICATING SEMICONDUCTOR DEVICE

CROSS REFERENCE TO RELATED APPLICATION

This application is a continuation of U.S. application Ser. No. 13/599,493 filed Aug. 30, 2012 (now pending), which is based upon and claims the benefit of priority from prior Japanese Patent Application No. 2012-035018, filed on Feb. 21, 2012. The entire contents of these prior applications are incorporated herein by reference.

FIELD

Exemplary embodiments described herein generally relate to a method for fabricating a semiconductor device, the method providing a desired pattern on a substrate by lithography.

BACKGROUND

A residual film or a concave scratch may be formed on a back surface of a substrate to be processed which has been performed various processes such as forming, etching or the like in an LSI production. When the back surface of the substrate is fixed on a stage in lithography process, the substrate is distorted due to the residual film or the concave scratch. As a result, a flat standard surface cannot be formed on the surface of the substrate to deteriorate the lithography process. Therefore, solving the back surface of the substrate by a chemical solution has been performed.

On the other hand, as a silicon oxide film, a silicon nitride film or the like is deposited on the back surface of the substrate, it is difficult to collectively solve these films with high speed. Further, even if these films are collectively solved, a concave scratch is leaved.

Polishing the back surface of the substrate can be considered for a method to collectively remove the residual film or the concave scratch. In the polishing, the back surface of the substrate, which is polished, is applied with polishing load 100-500 hPa, for example. Accordingly, a substrate retaining mechanism is necessary to support the polishing load. It is desirable that a retaining plate is disposed at a surface side opposite to the surface to be polished.

When the back surface of the substrate is polished in a LSI production, the front surface with a LSI structure of the substrate is retained. Consequently, a fine LSI structure can be damaged or contaminated.

As another method for retaining a substrate, a method of holding only a side surface has been known. However, the substrate is distorted with increasing the polishing load. Especially, distortion amount in a center of the large scale substrate becomes large, therefore, polishing cannot be effectively performed and is capable of relating to crystalline defects or crack of the substrate. Furthermore, as the substrate is polished with high speed, suitable polishing load is necessary. Accordingly, the retaining method fixing the side surface is not fit to the polishing processing.

DETAILED DESCRIPTION

An aspect of the present embodiment, there is provided a method of fabricating a semiconductor device includes performing a back surface processing to remove at least one of a scratch and a foreign material formed on a back surface of a substrate to be processed, a front surface of the substrate being retained in a non-contact state, contacting the back surface of the substrate to a stage to be retained, and providing a pattern on the front surface of the substrate by using lithography.

The present Embodiments will be described below in detail with reference to the attached drawings mentioned above. Throughout the attached drawings, similar or same reference numerals show similar, equivalent or same components.

First Embodiment

Figure 1:
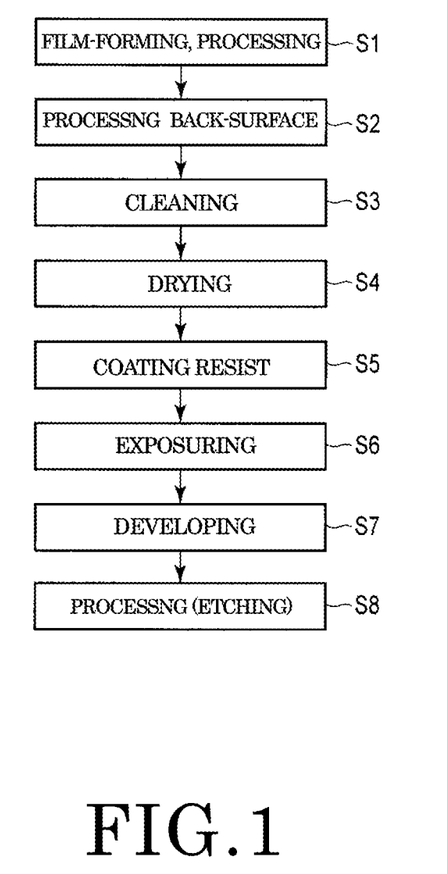
FIG. 1 is a flowchart showing a fabrication process of a semiconductor device according to a first embodiment.

FIG. 1 is a flowchart showing a fabrication process of a semiconductor device according to a first embodiment. Here, a pattern is provided on a substrate by photolithography using a mask.

A substrate performed forming a film, etching a film or the like is used as a substrate to be processed before lithography (Step S1). Surfaces including a back surface of the substrate are polished (Step S2). In the polishing, a scratch and a foreign material on the back surface are removed by using a static pressure bearing in a state that the front surface of the substrate is retained as non-contact to a periphery environment.

After Step 2, the back surface of the substrate is cleaned (Step S3). Furthermore, the back surface of the substrate is dried (Step S4). The polishing, the cleaning and the drying (S2-S4) are desired to be performed in a same chamber.

After coating a resist on the front surface of the substrate (Step S5), a pattern exposure is performed by using a photo mask (Step S6). After S6, developing the substrate is performed to provide a resist pattern (Step S7).

The film to be processed is selectively etched by dry-etching using the resist pattern as a mask so that the film to be processed is etched as a prescribed pattern.

Next, the first embodiment is described in detail below.

Generating a failure due to a foreign material such as a residual film or a dust is prevented before lithography. The foreign material is attached on the back surface of the substrate to be processed. In such a manner, back surface processing, polishing for example, is performed to the back surface of the substrate between forming a film or etching a film and patterning by lithography. The residual film, a scratch or convexoconcave on the substrate can be collectively removed by polishing.

When the substrate is polished, it is necessary to apply some extent of polishing load, 100-500 hPa for example, on the back surface of the substrate to be polished. As a substrate-retaining mechanism for the polishing load, fix of an edge portion of the substrate may be used when the polishing load is comparatively low. On the other hand, the surface corresponded to the surface to be polished, on which lithography process is performed, can be retained by a static pressure bearing when the polishing load is comparatively high. A pressure fluid is selected from water, organic solvent, liquid with an organic material and high pressure gas. Gas is desired as the fluid fed from the static pressure bearing which faces to the surface with devices. In a case of liquid, corrosion of a fine pattern may be caused in the production. Further, when drying the device surface contacted to liquid, some kinds of defects such as watermark, distortion of the pattern or the like can be generated.

Figure 2A:
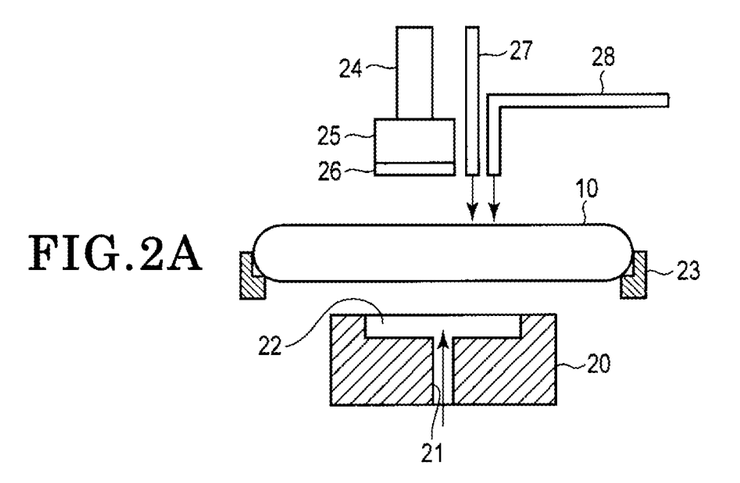
FIGS. 2A, 2B are cross sectional views, each view showing a constitution of a substrate processing apparatus using a static pressure bearing according to the first embodiment.
Figure 2B:
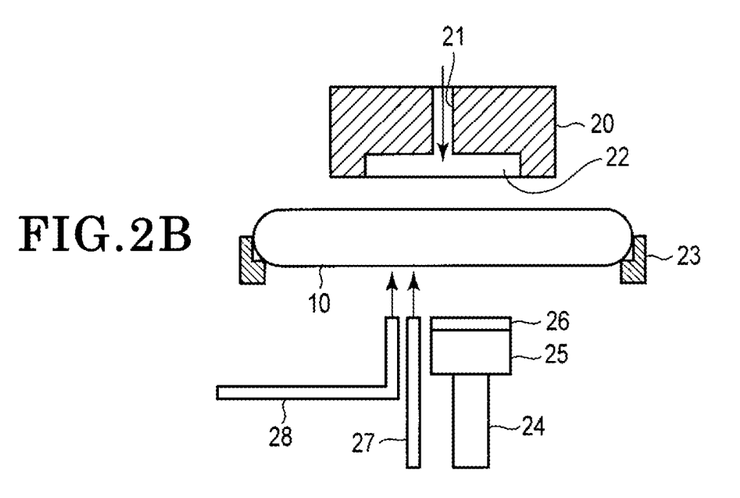

FIGS. 2A, 2B are cross sectional views, each view showing a constitution of a substrate processing apparatus using a static pressure bearing according to the first embodiment.

FIG. 2A shows an example in which a static pressure bearing 20 is located under a substrate to be processed 10. The static pressure bearing 20 includes an inlet pipe 21 for pressure fluid and a pocket 22 for retaining the pressure fluid. The load applied to the substrate 10 is accepted with the pressure fluid in the pocket 22 and a front surface of the static pressure bearing 20 overflowed from the pocket 22. A retainer 23 which retains a side portion of the substrate 10 is provided at an upper side of the static pressure bearing 20. When the substrate processing apparatus performs polishing a substrate or the like, the static pressure bearing 20 is configured to move upward towards the substrate and to move downward after the polishing is finished. Instead of the up-down movement, an up-down mechanism of the substrate 10 can be set.

A polishing head with a smaller diameter than a diameter of the substrate 10 is located at an opposed side to the substrate surface side of the static pressure bearing 20. A processing member 26 constituted with, for example, a soft material such as a sponge, a non-woven cloth, a foamed poly-urethane or the like, or a polishing tape, and a holder 25 holding the processing member 26 are set at a leading edge of the polishing head. It is available that the holder 25 may be not set. Further, the polishing head is supported with a supporting body (not shown) and is configured to act rotation, orbital motion, up-and-down motion and the like. In such a manner, the polishing head 24 with the smaller diameter than the diameter of the substrate is configured to polish the total surface of the substrate. Furthermore, the polishing head 24 is configured to touch the substrate 10 due to the load applied through the supporting body.

When a polishing processing is performed, a polishing solution is provided from a slurry supply pipe 27. When cleaning processing is performed, a cleaning solution is provided from a cleaning solution supply pipe 28. Two-fluid jet nozzle or a mega-sonic cleaning nozzle can be set at a leading edge of the cleaning solution supply pipe 28. Meanwhile, the nozzles can be located another portion. Pure water, solution added a surfactant, cleaning solution controlling pH or the like is used as the cleaning solution. Meanwhile, a chemical solution diluted with another chemical solution or solvent can be used as the cleaning solution. One kind of cleaning solution may be used; however, two or more kinds of cleaning solutions may be used as an order or parallel usage. Furthermore, it is not restricted that the same pipe can be used both the slurry supply pipe 27 and the cleaning solution supply pipe 28.

The retainer 23 is connected to a rotation mechanism (not shown) to be configured to rotate with a high speed rotation. In a case that solvent or vapor with lower vapor pressure is provided on the substrate in drying, a supply pipe for the solvent or the vapor can be located.

In FIG. 2A, the back surface processing, the cleaning processing and the drying processing are performed in a same chamber as an example. However, these processes can be performed in each chamber.

FIG. 2B shows an example as another processing apparatus. FIG. 2B shows an example in which the static pressure bearing 20 is located upper the substrate to be processed 10. A basic function of the apparatus in FIG. 2B is the same as the apparatus in FIG. 2A.

In the polishing processing using the apparatus described above, a polishing portion, which is the processing member 26, is touched to the surface to be processed, which is the back surface of the substrate to be processed 10, to apply the polishing load onto the surface to be processed through the polishing portion. A member with suitable hardness or material property for removing foreign materials and convexoconcave is located on a surface of the polishing portion. A size of the polishing portion and a number of the polishing portions are not especially restricted. Not only polishing the back surface of the substrate but a bevel portion of the substrate can be polished. The polishing portion and the substrate in the processing may be rotated without fixing.

When the polishing portion is touched on the surface to be processed, the removed foreign materials or reaction products in the processing can be exhausted out of the substrate by providing liquid such as polishing solution or pure water onto the surface to be processed. The polishing solution with abrasive grains, the polishing solution without abrasive grains, surfactant or the like can be used.

An amount of the polishing is dependent on the foreign materials, size of convexoconcave to be removed, and is desired to be set corresponding to a target value of a prescribed flatness of the substrate surface. Further, the amount of the polishing is necessary to be over 50 nm when the convexoconcave over 100 nm is completely removed. In this case, the amount of the polishing is set to be 50 nm when the convexoconcave below 50 nm can be acceptable.

When the foreign materials are attached on the back surface of the substrate with less convexoconcave, effect of removing the foreign materials can be sufficiently obtained in the amount of the polishing under a half size of the foreign materials. Furthermore, effect of removing the foreign materials can be obtained in a case that the polishing is zero which is performed by only pure water used as the polishing solution.

After polishing, the foreign materials and the reaction products, which are removed, are cleaned to be reliably exhausted out of the substrate. In the cleaning, contacting approach having a cleaning solution and a sponge brush, for example, or a non-contact approach can be used. Further, both the contacting approach and the non-contact approach can be concurrently used. However, the substrate may be reversely contaminated from the sponge brush or the like in the contacting approach. Accordingly, the non-contact approach is desired to be used in a final stage.

Using not only pure water but chemical solution as the cleaning solution derives high efficiency for removing an attachment such as a foreign material, residue, a dust or the like on the surface to be polished. A surfactant preventing the attachment from re-attaching, an additive agent, a component controlling pH of the chemical solution, an additive agent reacting with a polishing residue to solve or to form a reaction product with water solubility, a protective agent for a polishing surface or the like can be used as a component of the chemical solution. Such the chemical solutions can be not only used in the process of the contacting approach and the non-contact approach but also be provided before cleaning or after cleaning. Furthermore, the polishing surface can be finished as a clean state in a case that a chemical solution can dissolves the polishing surface or the foreign material. When two-fluid jet cleaning, mega-sonic cleaning or the like is concurrently used with the chemical cleaning, higher cleaning performance can be achieved as compared to the substrate rinse with chemical solution.

When the two-fluid jet cleaning or the like is performed, movement or the like of the jet nozzle between the center of the substrate with rotation and the periphery of the substrate is performed to irradiate the jet stream or the like to the substrate surface. Pure water or the like with high pressure vapor is sprayed in the two-fluid jet cleaning. However, water dissolved $CO_2$ gas or the like can be used alternately to pure water. As the high pressure vapor, clean vapor without a fine particle as possible is used. However, a kind of the vapor is not restricted when safety is maintained such as air, nitrogen or the like. A flow rate of the liquid used in the two-fluid jet cleaning is suitable in a rage from several ml/min to several hundreds ml/min. A flow rate of the vapor is suitable in a rage from several tens l/min to several hundreds l/min.

Finally, the substrate is dried by high speed rotation or lower vapor pressure vapor such as IPA or the like and is shifted to next processing, resist coating and lithography.

Figure 3A:
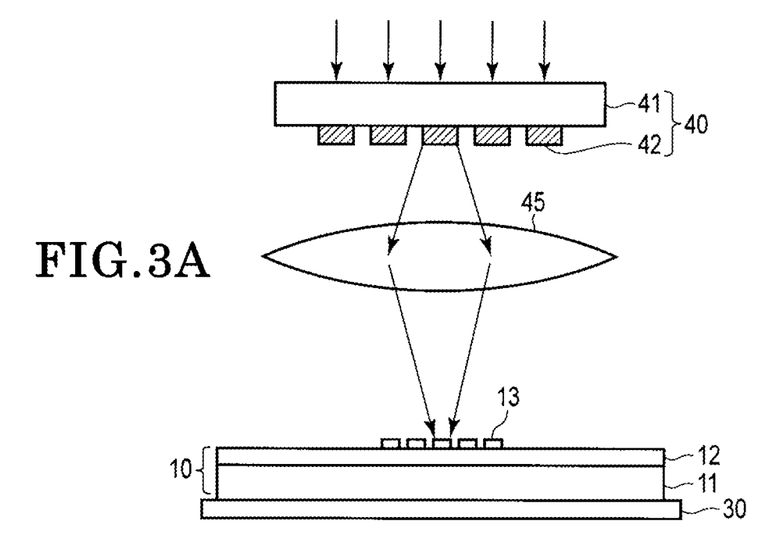
FIGS. 3A, 3B is a schematic view showing an effect according to the first embodiment.
Figure 3B:
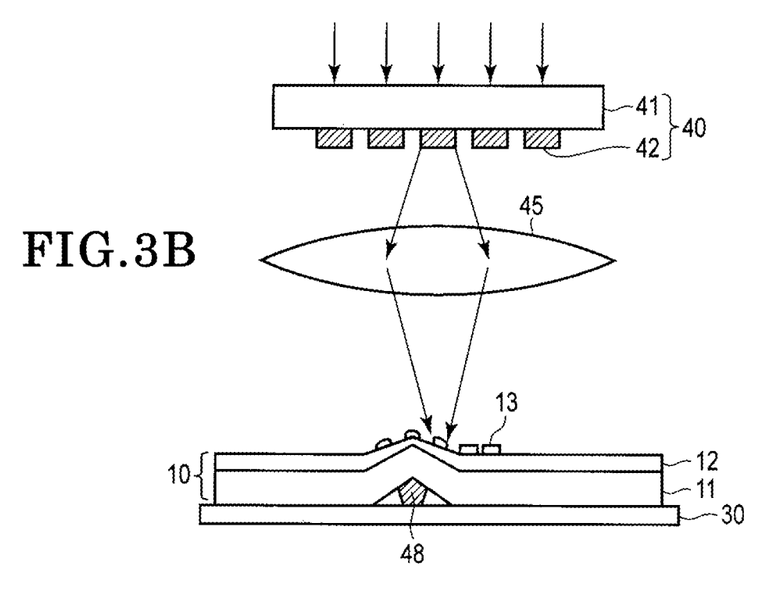

An aspect of lithography according to the first embodiment accompanying with a comparative case is shown in FIGS. 3A, 3B. For simple understanding, a resist 13 in the FIGS. 3A, 3B has been already patterned, however, the resist 13 is really set to be entirely coated on the substrate in exposure processing.

In the substrate 10 to be processed, a film to be processed 12 is coated on a Si substrate 11. A resist 13 is coated on the substrate 10 to be processed. A mask 40 for photolithography in which a pattern composed of Cr formed on a surface of a quartz glass is disposed above the substrate 10. A pattern of the mask 40 for photolithography is reduce-projected with light having mono-wavelength laser or the like from an upper portion of the mask 40 through a lens system 45. The back surface of the substrate 10 is contacted to a flat plane of the stage so that the substrate is retained on the stage 30 by electro-static chuck or the like. In such a manner, the surface flatness of the substrate is retained.

As shown in FIG. 3A, the foreign material is removed from the back surface of the substrate 10 so that the front surface of the substrate 10 has flatness. Therefore, a mask pattern is precisely transferred on the resist 13. This is because a concave scratch, residual film or the like can be surely removed by polishing the back surface of the substrate before the lithography described above.

On the other hand, when the back surface of the substrate closely attaches to a flat surface in a state where a foreign material 48 attaches on the front surface of the substrate, the substrate is distorted not to be able to retain flatness of the substrate as shown in FIG. 3B. Consequently, a pattern reduce-projected on the resist 13 loses shape, so that the pattern cannot be formed in subsequent processing. The same influence as the above case is generated where convexoconcave of the substrate, scratch, surface roughness or the like, for example, not limiting the foreign material, is formed on the back surface. Back surface processing on the substrate solves the problem according to the first embodiment.

Figure 4:
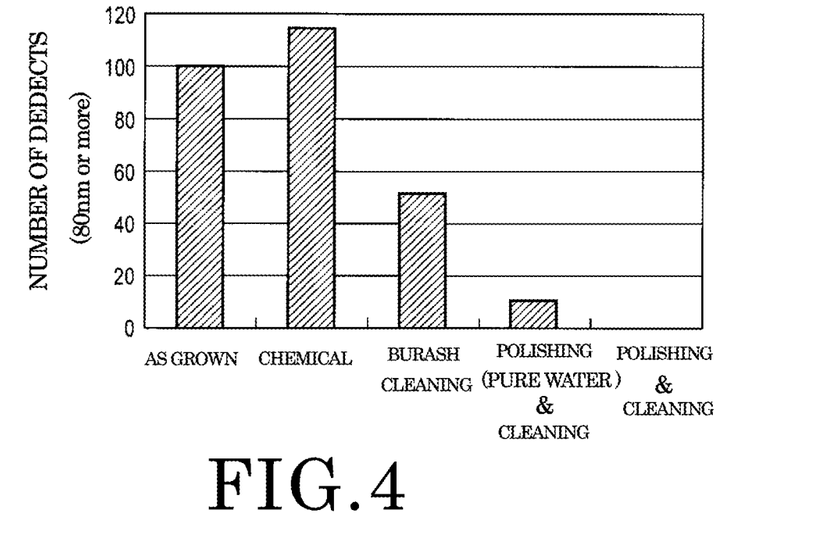
FIG. 4 is a characteristic view showing the effect according to the first embodiment.

An effect of the first embodiment is described in reference to FIG. 4. FIG. 4 shows a number of the defects over 80 nm after some kind of processes to remove convexoconcave or the foreign materials of the front surface and the back surface of the substrate. A $SiO_2$ film with 200 nm thickness formed on a silicon wafer by CVD is used as the reference. A number of the defects on the $SiO_2$ film after CVD are represented as 100, further a number of the defects of each process are relatively represented.

Chemical solution processing combined with diluted HF and alkali solution after forming $SiO_2$ cannot decrease a number of defects but slightly increase the number of defects. This is because surface roughness of the film or the like is generated due to dissolution of the $SiO_2$ film by diluted HF to increase the number of the defects.

When a brush cleaning is performed, the number of the defects is decreased by half, however, another half is leaved so that removing effect cannot fully obtain.

On the other hand, when a polishing portion is pressed on the surface of the $SiO_2$ film by using only pure water without abrasive grain or chemical solution, successively cleaning by chemical solution and two-fluid jet nozzle cleaning are performed, the number of the defects is decreased to tenth part of the defects according to the first embodiment. The residual defects are slightly concave removed signatures after each foreign material is removed without a residue. Pressure by the fluid is 100 hPa in the above case, the number of the defects is decreased with increasing the pressure.

In a case that the polishing portion is pressed on the back surface of the substrate with feeding a slurry with abrasive grains, which has an effect to flatten a surface of the foreign material, onto the surface of the $SiO_2$ film, successively the same cleaning is performed, defect zero is attained over 200 hPa of the pressure by the polishing portion. In other word, surely removing the scratch or the foreign material on the back surface of the substrate by polishing can be confirmed.

According to the first embodiment, the back surface of the substrate 10 is performed by the back surface processing in a state where the front surface side of the substrate to be processed 10 is retained by static pressure bearing 20 before lithography using a mask 40. In such a manner, the concave scratch or the foreign material can be removed without damaging the pattern of the front surface of the substrate. The front surface side of the substrate is necessary to be held, for example, when the back surface processing is performed to the back surface of the substrate in halfway of the production on the substrate with a fine LSI structure on the front surface. In such a case, the fine LSI structure is probably broken. Therefore, the processing cannot be conventionally performed. As the static pressure bearing can retain without contacting to the fine LSI structure, the back surface of the substrate can be easily cleaned. Accordingly, flatness of the front surface of the substrate can be enhanced when the back surface of the substrate is chucked to a flat surface so as to be easily aligned in focusing of a lithography process. As a result, pattern process accuracy can be enhanced.

As the method can be performed by using a small area apparatus having a polishing head with a small diameter and collectively performed from the polishing to the cleaning and the drying, so as to have high productivity, low cost, saving space or the like as advantages. Furthermore, as the front surface side of the substrate retains by the static pressure bearing using pressure fluid, the processing solution cannot inserted into the front surface of the substrate. Accordingly, the front surface contamination by the processing can be prevented. Using the static pressure bearing in the cleaning processing can prevent the cleaning solution from inserting the front surface side of the substrate and contaminating with the inserting.

Instead of photolithography using a mask for exposure, electron beam lithography in which directly pattern on the resist by using electron beam can be performed as the lithography in the first embodiment. Furthermore, the method can be applied to imprint lithography using a stamp a. In imprint lithography, the stamp a with a pattern is pressed on the resist on the substrate in stead of steps 6, 7 in FIG. 1.

In such manners, removing the concave scratch or the foreign material to clean the back surface of the substrate without damaging the pattern formed on the front surface of the substrate provides improvement on flatness of the surface of the substrate fixed the back surface of the substrate to the flat surface. Consequently, the same effect which means enhancing pattern process accuracy can be obtained.

Second Embodiment

Figure 5:
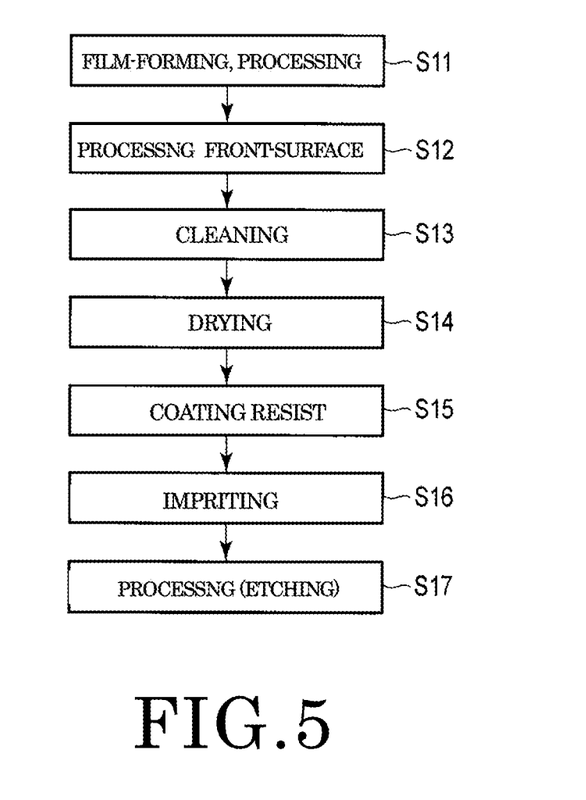
FIG. 5 is a flowchart showing a fabrication process of a semiconductor device according to a second embodiment.

FIG. 5 is a flowchart showing a fabrication process of a semiconductor device according to a second embodiment. Here, a pattern is provided on a substrate to be processed by nano imprint lithography (NIL) using a stampa.

A substrate to be processed by forming a film, etching a film or the like is used before lithography (S11). Surfaces including a front surface of the substrate to be processed are polished (S12). In the polishing, a scratch and a foreign material on the front surface of the substrate are removed by using the static pressure bearing in a state where the back surface is retained as non-contact to an environment.

Specifically, the polishing portion is touched to the surface of the substrate and the polishing load is applied onto the surface to be processed through the polishing portion in a state where the back surface side of the substrate is retained by the static pressure bearing using the substrate processing apparatus described in FIG. 2. when the polishing is performed in the state where the polishing portion is touched to the surface to be processed, liquid, slurry, pure water, or the like is provided on the surface to be polished so that the removed foreign materials or reaction products during the processing can be to exhausted out of the substrate.

After polishing, the surface of the substrate is cleaned to surely remove foreign materials or reaction products out of the substrate (S13). Subsequently, the substrate is dried by high speed rotation or lower vapor pressure such as IPA or the like (S14). The polishing, the cleaning and the drying are desired to be performed in a same chamber so that attachment of new foreign materials on the cleaned surface or back surface of the substrate is prevented.

Next, a resist is coated on the front surface of the substrate (S15), successively imprint processing using a stampa is performed to provide a resist pattern on the front surface of the substrate (S16).

The film to be processed is processed as a desired pattern by selectively etching the film to be processed on the substrate by dry etching using the resist pattern as a mask (S17).

A method of processing the back surface of the substrate before lithography in the first embodiment described above. On the other hand, processing the front surface of the substrate, namely the front surface with devices including polishing is performed before lithography, especially, NIL processing according to the second embodiment.

When a foreign material is attached on the surface or in the underlying film in NIL processing, damage of a stampa is generated to cause a continuous pattern defect. Removing the foreign materials and flattening, in which the polishing is performed on the front surface with devices before lithography, can prevent the damage of the stampa in NIL processing so as to lead precisely forming a pattern by lithography. Furthermore, totally removing the foreign materials by the polishing can prevent at least the damage of the stampa in NIL processing.

Conventional CMP (Chemical Mechanical Planarization) processing can be used as the polishing processing to polish the surface with the devices of the substrate in this method. The surface to be polished can be applied to a polishing pad with providing liquid such as the polishing solution or pure water in the first embodiment in the CMP. Another processing such as cleaning, drying or the like can be performed according to the processing flow as same as the first embodiment.

FIGS. 6A-6H are cross-sectional views showing processing steps according to the second embodiment (FIGS. 6A-6D) and a comparative case (FIGS. 6E-6H).

Figure 6A:
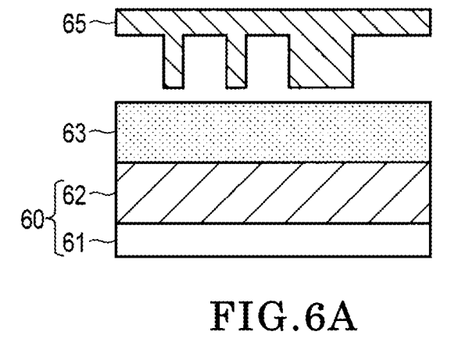
FIGS. 6A-6H are cross-sectional views showing processing steps according to the second embodiment.

In a case that NIL method is performed, a substrate to be processed 60, which is an underlying film 62 is deposited on a Si substrate 61, is prepared. After a resist 63 is coated on the substrate to be processed 60, a stampa 65 is applied on the substrate to be processed 60.

Figure 6B:
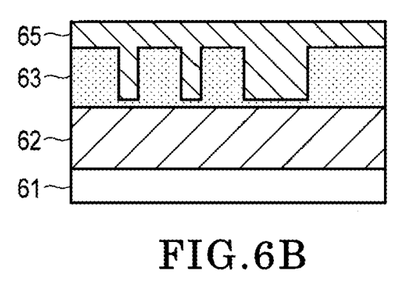
Figure 6C:
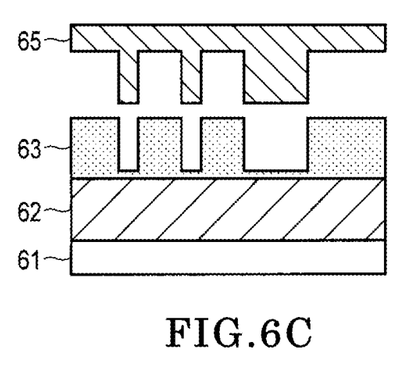
Figure 6D:
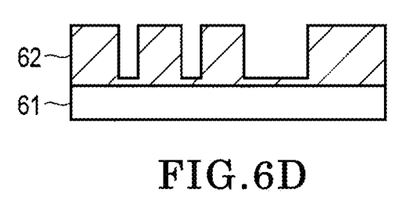

When a foreign material is not attached on the back surface of the substrate as shown in FIG. 6A, the stampa 65 is pressed into the resist 63 as shown in FIG. 6B. After curing the resist 63, a resist pattern is precisely obtained as shown in FIG. 6C by unfixing the stampa 65 from the resist 63. The underlying film 62 is selectively etched by RIE or the like using the resist pattern as a mask to obtain a desired pattern as shown in FIG. 6D.

Figure 6E:
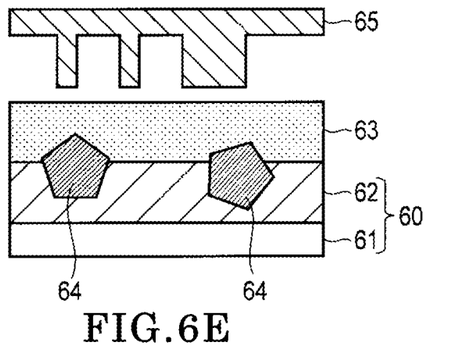

On the other hand, a foreign material 64 can be mixed onto or into the surface or an inner portion, respectively, of the underlying film 62, the resist 63 or substrate 61 as shown in FIG. 6E. It is considered that an attachment on the substrate 61, a dust generated during a film formation process, a micro particle mixed into the resist 63, a foreign material or contamination attached at storing, feeding or the like in the processing steps as the foreign material 64. When a thin film is deposited on the surface of the LSI device in the processing steps, a source gas in CVD and a target material including a source material is used. A source gas reacts to generate solid above the substrate in a CVD chamber, so that the solid attached on the surface of the substrate. A product generated in sputtering is attached to an inner wall of the sputtering chamber which is removed to be attached on the surface of the substrate. Such the attachment fall down on the surface of the substrate in initial stage or halfway stage, so that the attachment is embedded into the thin film.

Figure 6F:
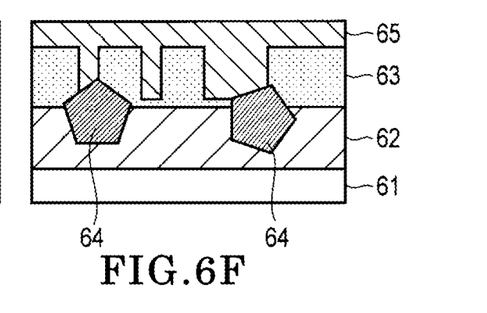
Figure 6G:
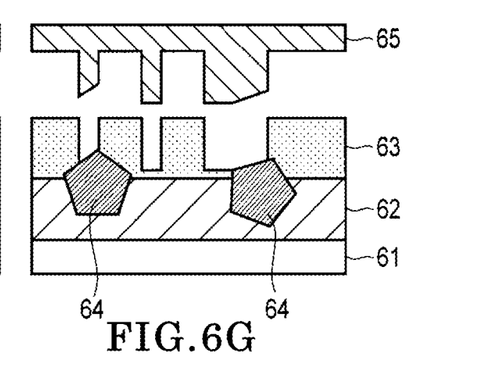
Figure 6H:
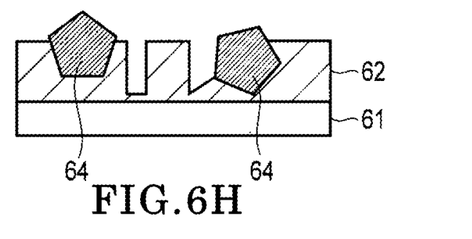

When the stampa 65 contacts to the foreign material 64, the stampa 65 is damaged to be broken as shown in FIG. 6F. As another case, the foreign material 64 may cut into the stampa 65 to be fixed. Furthermore, patterning on the resist or the underlying film 62 can be prevented due to residual foreign material 64 as shown in FIG. 6G, 6H. The stampa 65 is an original version as the patterning. Accordingly, the defect of the stampa 65 is transferred into subsequent patterns to cause a pattern defect when the stamp a 65 has such the defect. Removing the foreign material left on the surface of the substrate by polishing can prevent the generation of the pattern defects according to the embodiments.

Polishing the front surface of the substrate to be processed before imprint-lithography is capable of easily removing a concave scratch or a foreign material according to the second embodiment. In such a manner, pattern processing accuracy in imprint-lithography can be obtained and generation of damage on the stamp a can be prevented before happens. Furthermore, as the back surface side of the substrate 60 retains by the static pressure bearing using pressure fluid when the surface of the substrate is polished, the processing solution cannot inserted into the back surface of the substrate. Accordingly, the back surface contamination by the processing can be prevented. Using the static pressure bearing in the cleaning processing can prevent the cleaning solution from inserting the back surface side of the substrate and contaminating with the inserting. The back surface of the substrate without contamination is greatly effective in imprint lithography, when the flatness of the front surface of the substrate is enhanced by fixing the back surface of the substrate to a flat surface.

The polishing processing of the back surface of the substrate as described in S2-S4 according to the first embodiment can be performed before the polishing processing of the front surface of the substrate as described in S12 in the second embodiment. Cleaning and flattening at the back surface side of the substrate can be attained in the above processing. Flattening the back surface of the substrate is especially effective for imprint-lithography, because the flattening the back surface of the substrate is related to flattening the front surface of the substrate in a case that the back surface of the substrate is fixed to a flat surface.

(Modification)

An embodiment is not restricted to the two case mentioned above.

In a state where a main surface side of the substrate is retained in non-contact, another surface of the opposed side of the substrate is polished in the embodiments. However, the processing of the surface of the substrate is not necessary limited to polishing. Scrubbing by a brush, blowing fluid or the like may be used when these methods can remove a foreign material and a scratch on the surface of the opposed side to the main surface of the substrate. In this case, a liquid including fine abrasive grains mixed in gas is sprayed into the substrate to be processed with high pressure and high speed to process the substrate to be processed, for example. This method is called wet blast technology. Abrasive grains with below several μm of a diameter can be used as the fine abrasive grains. Further, it is not restricted to a static pressure bearing as retaining the surface of the opposed side of the substrate to be processed. A method of retaining the surface without contacting may be suitable.

Lithography in the first embodiment is not restricted to photo lithography mentioned above, electron-beam lithography or imprint lithography. Printed electronics, which provides a pattern by printing using a printing solution mixed fine particles, can be applicable. Namely, various kinds of lithography techniques, each of which is required that the front surface of the substrate has higher flatness in a state where the back surface of the substrate touches to a flat surface.

Slurry used in the processing a front surface and back surface of the substrate, or conditions of polishing amount, pressure in contacting or the like can be suitably changed corresponding to specification. In a same fashion, chemical solutions or the like used in the cleaning can be suitably changed corresponding to specification.

Other embodiments of the present disclosure will be apparent to those skilled in the art from consideration of the specification and practice of the disclosure disclosed herein. It is intended that the specification and example embodiments be considered as exemplary only, with a true scope and spirit of the disclosure being indicated by the claims that follow. The disclosure can be carried out by being variously modified within a range not deviated from the gist of the disclosure.

What is claimed is:

1. A method for fabricating a semiconductor device, comprising:
   retaining a substrate by contacting a side surface of the substrate with a retainer, the side surface being disposed between a front surface and a back surface of the substrate;
   contacting a polishing head having a diameter smaller than a diameter of the substrate onto the back surface of the substrate to polish the substrate by sliding on the back surface of the substrate; and
   providing a pattern on the front surface of the substrate after the polishing;
   wherein liquid supplied to a static pressure bearing located facing the front surface of the substrate contacts the front surface of the substrate to apply pressure on the front surface of the substrate in the polishing of the back surface of the substrate such that the liquid presses on at least a first area on the front surface of the substrate opposite to a second area on the back surface of the substrate that is contacted by a center of the polishing head so as to receive polishing load applied to the back surface of the substrate, and
   wherein when the polishing is performed, the static pressure bearing is configured to move upward toward the substrate and to move downward after the polishing is finished.

2. The method of claim 1, wherein
the liquid is contacted to the surface of the substrate in a state that the static pressure bearing is located under the substrate in the polishing.

3. The method of claim 1, wherein
the polishing load applied to the back surface of the substrate is not less than 100 hPa in the polishing.

4. The method of claim 3, wherein
the polishing load applied to the back surface of the substrate is not less than 100 hPa and not more than 500 hPa in the polishing.

5. The method of claim 1, wherein
the retainer is located at an upper side of the static pressure bearing.

6. The method of claim 1, wherein
the polishing is performed with feeding a polishing liquid on the back surface of the substrate.

7. The method of claim 1, wherein
a polishing amount of the back surface of the substrate is not less than 50 nm in the polishing.

8. The method of claim 1, wherein
the back surface of the substrate is polished by using a polishing tape in the polishing.

9. The method of claim 1, wherein
the liquid is water or oil.

10. The method of claim 1, further including
cleaning the substrate and successively drying the substrate after the polishing and before the providing of the pattern.

11. The method of claim 10, wherein
the polishing, the cleaning and the drying are performed in same chamber.

* * * * *